(12) United States Patent
Holm et al.

(10) Patent No.: US 9,739,842 B2
(45) Date of Patent: Aug. 22, 2017

(54) MAGNETIC FIELD SENSOR WITH SKEWED SENSE MAGNETIZATION OF SENSE LAYER

(71) Applicant: FREESCALE SEMICONDUCTOR, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 45 days.

(21) Appl. No.: 15/006,952

(22) Filed: Jan. 26, 2016

(65) Prior Publication Data

US 2017/0212176 A1    Jul. 27, 2017

(51) Int. Cl.
*G01R 33/02* (2006.01)
*G01R 33/00* (2006.01)
*G01R 33/09* (2006.01)
*G01R 17/10* (2006.01)

(52) U.S. Cl.
CPC ......... *G01R 33/0005* (2013.01); *G01R 17/10* (2013.01); *G01R 33/098* (2013.01)

(58) Field of Classification Search
CPC ............... G01R 33/0005; G01R 17/10; G01R 33/093–33/098; G01R 31/3187; G01R 15/207; H01L 43/12; G01N 27/74
USPC ........ 324/219–252, 200, 207.2–207.24, 500, 324/529–530, 750.12, 750.21, 754.17, 324/754.29; 338/32 R, 32 H; 365/157–158, 170–173, 225.5; 73/514.31, 514.39, 520.01, 779, 862.193, 73/862.333
See application file for complete search history.

(56) References Cited

U.S. PATENT DOCUMENTS

| | | | |
|---|---|---|---|
| 7,965,077 B2 | 6/2011 | Engel et al. | |
| 8,816,683 B2 * | 8/2014 | Wang ................... | G01R 33/098 324/207.21 |
| 2010/0276389 A1 | 11/2010 | Mather et al. | |
| 2011/0074406 A1 | 3/2011 | Mather et al. | |
| 2011/0244599 A1 | 10/2011 | Whig et al. | |
| 2012/0212217 A1 * | 8/2012 | Engel ................... | G01R 33/098 324/252 |
| 2014/0035570 A1 | 2/2014 | Jin et al. | |

(Continued)

FOREIGN PATENT DOCUMENTS

| | | |
|---|---|---|
| EP | 2 860 542 A1 | 4/2015 |
| EP | 2 860 543 A1 | 4/2015 |

*Primary Examiner* — Melissa Koval
*Assistant Examiner* — Trung Nguyen
(74) *Attorney, Agent, or Firm* — Charlene R. Jacobsen

(57) ABSTRACT

A magnetic field sensor comprises a sensor bridge having multiple sensor legs. Each sensor leg includes magnetoresistive sense elements, each comprising a pinned layer having a reference magnetization parallel to a plane of the sensor and a sense layer having a sense magnetization that is skewed away from three orthogonal axes. The sense magnetization of a portion of the sense elements is oriented in a first direction and the sense magnetization of a different portion of the sense elements is magnetically biased in a second direction by a permanent magnet layer. The second direction differs from the first direction by an opposing angular magnitude to yield a balanced sensor bridge that produces a zero-offset outcome in the absence of an external magnetic field.

20 Claims, 9 Drawing Sheets

(56) References Cited

U.S. PATENT DOCUMENTS

2014/0035573 A1 2/2014 Deak et al.
2014/0247042 A1 9/2014 Lei et al.

* cited by examiner

FIG. 10
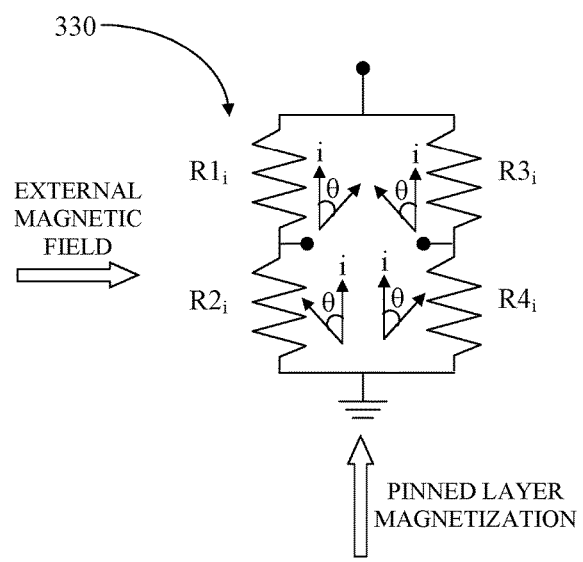
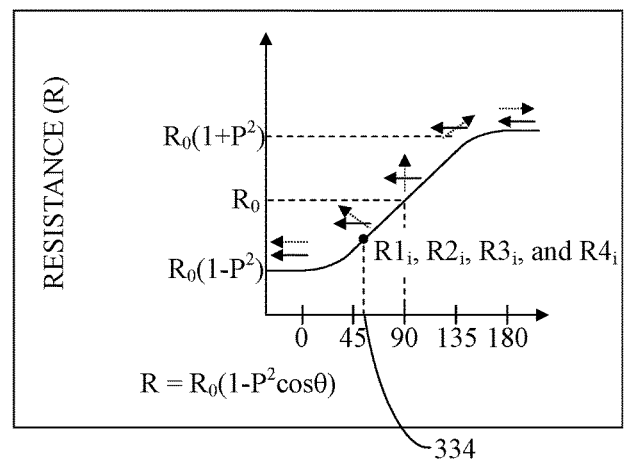

MAGNETIC FIELD SENSOR WITH SKEWED SENSE MAGNETIZATION OF SENSE LAYER

TECHNICAL FIELD OF THE INVENTION

The present invention relates generally to magnetoelectronic devices. More specifically, the present invention relates to a magnetic field sensor with multiple axis sensing and permanent magnet biasing.

BACKGROUND OF THE INVENTION

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, magnetoresistors, and so forth) and ferromagnetic materials (e.g., ferromagnetic magnetoresistors and flux guides). Other magnetic field sensors utilize optical, resonant, and superconducting properties.

In many Earth's field magnetic sensing applications, especially those involving compassing or orientation, it is extremely desirable to have three-axis sensing capability. In order to achieve low cost of such sensors, it is also desirable that the solution be a single chip or even fully integrable onto the accompanying application specific integrated circuit (ASIC) die. In handheld and miniaturized applications it is also critical to minimize power consumption in order to extend battery life.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 10 shows an exemplary Wheatstone bridge configuration with an accompanying plot of a zero-offset outcome resulting from any of the structures.

DETAILED DESCRIPTION

In overview, embodiments disclosed herein entail a magnetic field sensor capable of sensing magnetic fields along one or more mutually exclusive sense axes, typically referred to as the X-axis, Y-axis, and Z-axis. More particularly, a unique sensor bridge design of magnetoresistive sense elements is implemented for each sense axis. Each sensor bridge incorporates an in-plane orientation of reference magnetization of the pinned layer, along with out-of-plane, skewed biasing of the sense magnetization of the sense layer in two opposing directions. For each sensor bridge, one or more permanent magnet layers are strategically patterned (shape and position) to generate a unique external bias field vector of the sense magnetization of the sense layer to produce a balanced bridge configuration of magnetoresistive sense elements for the sensor bridge without built-in, zero field offset. Additionally, one sensor bridge design is utilized for sensing an external magnetic field that is perpendicular to the plane of the magnetic field sensor package without the use of flux concentrators. The strategically patterned permanent magnet layer(s) for this sensor bridge additionally allows it to respond to the out-of-plane external magnetic field without inter-axis coupling of sensor response. The various inventive concepts and principles embodied herein enable an ultra low power, multiple sense axis magnetic field sensor without detrimental perming effects for improved sensitivity, reliability, and cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
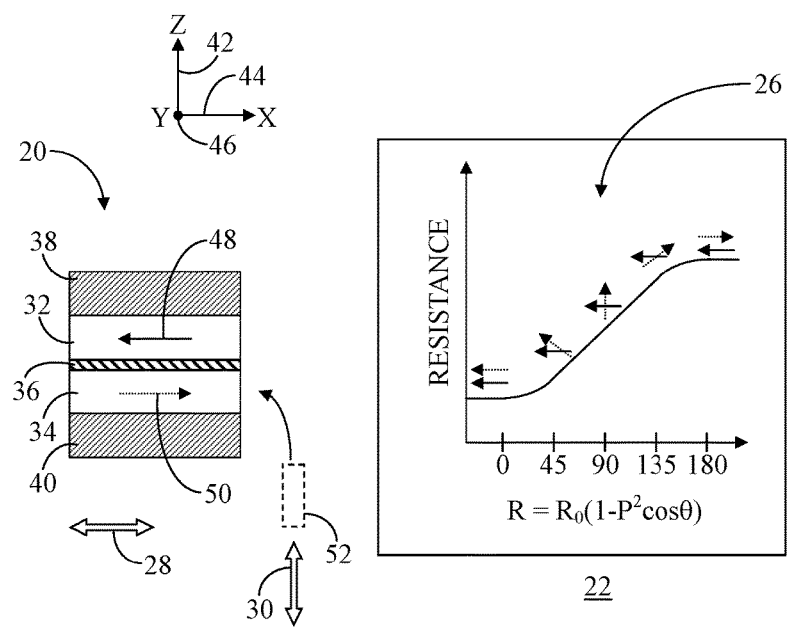
FIG. 1 shows a simplified side view of an exemplary magnetoresistive sense element with an accompanying plot of variable resistance that may occur in the presence of an external magnetic field.

Referring to FIG. 1, FIG. 1 shows a simplified side view of an exemplary magnetoresistive sense element 20 with an accompanying plot 22 of variable resistance 26 that may occur in the presence of an external magnetic field, represented by arrows 28, 30. More particularly, magnetoresistive sense element 20 may be a magnetic tunnel junction (MTJ) sensor. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes. Magnetoresistive sense element 20 is an exemplary magnetic tunnel junction (MTJ) structure that includes ferromagnetic layers 32, 34 separated by an insulator layer 36. An electrode 38 may be in electrical communication with ferromagnetic layer 32 and another electrode 40 may be in electrical communication with ferromagnetic layer 34. This structure may be formed within a dielectric material, not shown herein for simplicity.

In the side view illustration of FIG. 1, a Z-axis 42 is oriented up-and-down on the page, an X-axis 44 is oriented right-and-left on the page, and a Y-axis 46 is represented as a dot that depicts an axis going either into or out of the page on which FIG. 1 is situated. Thus, the X-Y plane in this side view illustration is oriented right-and-left and into or out of the page. Accordingly, external magnetic field 28 represents a magnetic field that is parallel to the X-Y plane of magnetoresistive sense element 20. More particularly, external magnetic field 28 is generally parallel to X-axis 44. Conversely, external magnetic field 30 represents a magnetic field that is perpendicular to the X-Y plane of magnetoresistive sense element 20. That is, external magnetic field is generally parallel to Z-axis 42.

Ferromagnetic layer 32 may be fixed, or "pinned," to have a reference magnetization, as represented by a solid arrow 48. Therefore, ferromagnetic layer 32 is referred to hereinafter as pinned layer 32. Ferromagnetic layer 34 is "free" to respond to, i.e., sense, the applied magnetic field (e.g., external magnetic field 38, 40) to provide a sense magnetization, represented by a dotted arrow 50. Sense magnetization 50 modulates the measured resistance 26. Accordingly, ferromagnetic layer 34 is referred to hereinafter as sense layer 34.

At a fixed voltage bias, resistance 26 depends upon the magnetic states of electrodes 38, 40. Since electrodes 38, 40 are electrically coupled with pinned and sense layers 32, 34, respectively, the states of electrodes 38, 40 depend upon the alignment of the magnetic moments of the pinned and sense layers 32, 34. By way of example and referring to plot 22, in the presence of X-axis external magnetic field 28, when the magnetic moments of pinned and sense layers 32, 34 are parallel (i.e., the vectors lie along parallel lines and point in the same direction) resistance 26 of the junction is lowest. However, resistance 26 of the junction is highest when the magnetic moments are anti-parallel (i.e., the vectors lie along parallel lines but point in the opposite direction). And in between, resistance 26 of the junction varies as the cosine of the angle between magnetic moments. One or more MTJ resistors, such as magnetoresistive sense element 20, may be utilized to form either of an X-axis or a Y-axis magnetic field sensor for sensing an external magnetic field that is parallel to the X-Y plane of magnetoresistive sense element 20.

In order to sense Z-axis magnetic field 30 in a direction perpendicular to the X-Y plane of magnetoresistive sense element 32, one or more flux guides 52 (one shown in dashed line form) are also formed within the dielectric material (not shown) in which magnetoresistive sense element 20 is formed. Per convention, flux guides 52 can be used to guide Z-axis magnetic field 30 into the X-Y plane. Flux guides 52 are generally thin, narrow sheets of magnetic material typically used to guide flux, i.e., Z-axis magnetic field 30, to a preferred location. With the use of flux guides 52 incorporated into, for example, a Z-axis magnetic field sensor, Z-axis magnetic field 30 is suitably guided so that it can be sensed using one or more in-plane magnetoresistive sense elements 20.

For optimal Z axis response, flux guides 52 have a preferred magnetization orientation. That is, the magnetic polarization for each of flux guides 52 will be directed in a uniform, i.e., generally single, direction. Unfortunately, flux guides 52 are susceptible to corruption by exposure to externally applied magnetic fields (e.g., disturbing fields of approximately one hundred Gauss or more). This corruption, typically referred to as perming, can alter the magnetic state of flux guides 52 leading to unstable device characteristics including offset, axis alignment, and noise. Large offset shifts, axis rotations, and excess noise can be very difficult or even impossible to compensate/calibrate out of the sensor response and can render Z-axis magnetic field sensor 20 unusable.

Figure 2:
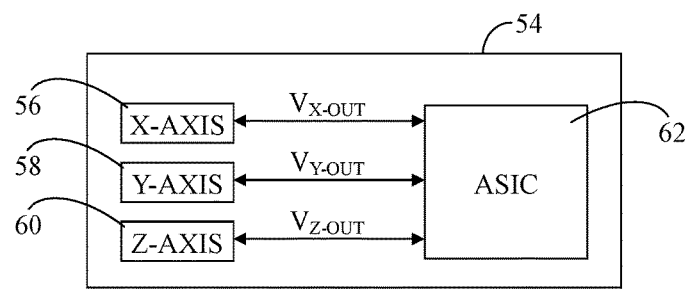
FIG. 2 shows a simplified block diagram of a magnetic field sensor package.

FIG. 2 shows a simplified block diagram of a magnetic field sensor package 54. Magnetic field sensor package 54 may be implemented in any device or system in which magnetic field sensing is required, for example, in compass, security, and military applications, in geophysics and space research applications, in biomagnetism and medical applications, and/or in non-destructive testing. In this example, sensor package 54 may be adapted to sense a magnetic field along three axes. Hence, sensor package 54 includes an X-axis magnetic field sensor 56, a Y-axis magnetic field sensor 58, and a Z-axis magnetic field sensor 60. Magnetic field sensors 56, 58, 60 may be coupled to, or otherwise in communication with, an application specific integrated circuit (ASIC) 62 to form sensor package 54. ASIC 62 performs some or all functions including, but not limited to, signal conditioning and data management, reset and stabilization control, bridge/output multiplexing, self-test, electrostatic discharge (ESD) protection, and so forth.

As will be discussed in significantly greater detail below, magnetic field sensor package 54 employs a triad of unique sensor bridge designs for X-axis 44, Y-axis 46, and Z-axis 42 magnetic field sensing. Each sensor bridge incorporates an in-plane orientation of reference magnetization of the pinned layer, along with out-of-plane, skewed biasing of the sense magnetization of the sense layer in two opposing directions. For each sensor bridge, one or more permanent magnet layers are strategically patterned (shape and position) to generate a unique external bias field vector of the sense magnetization of the sense layer to produce a balanced bridge configuration of magnetoresistive sense elements for the sensor bridge without built-in, zero field offset. Additionally, the strategically patterned permanent magnet layer(s) for a Z-axis sensor bridge design additionally allows it to respond to the out-of-plane external magnetic field without the use of flux concentrators and without inter-axis coupling of sensor response.

Figure 3:
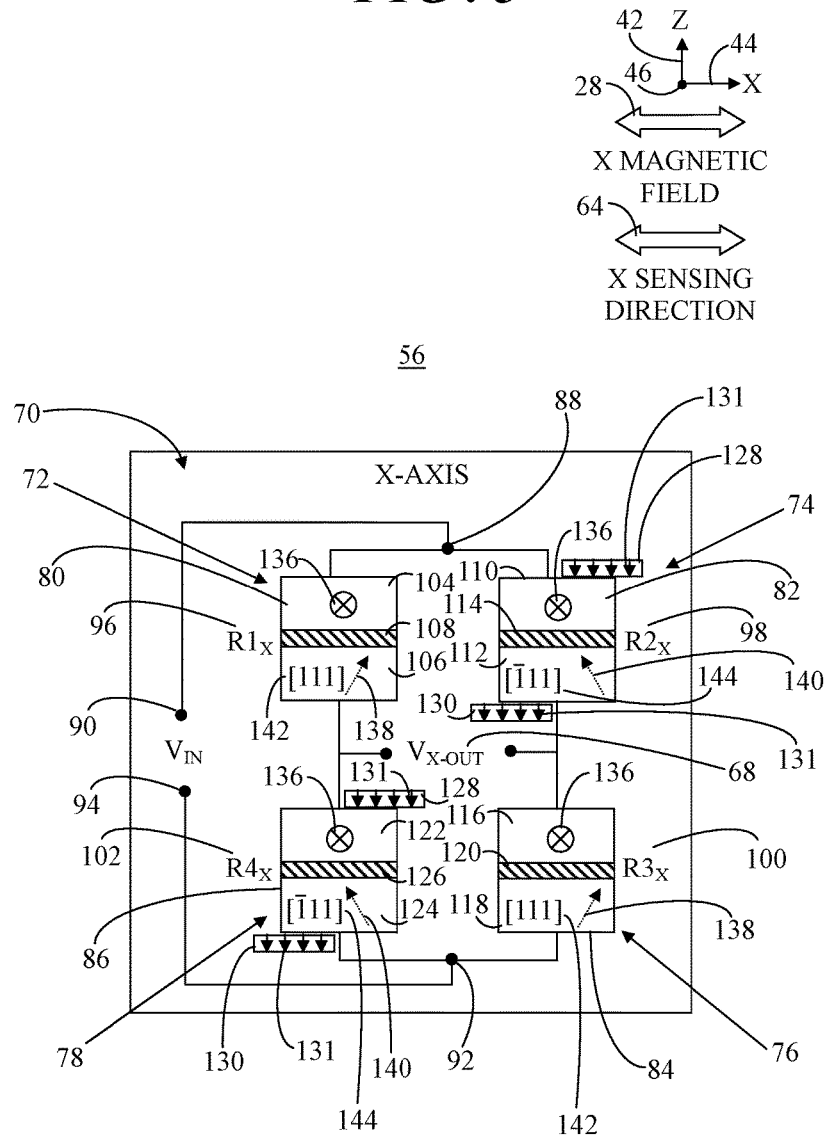
FIG. 3 shows a simplified schematic view of an X-axis magnetic field sensor the magnetic field sensor package of FIG. 2.

Now referring to FIG. 3, FIG. 3 shows a simplified schematic view of X-axis magnetic field sensor 56 of magnetic field sensor package 54 (FIG. 2). Accordingly, X-axis magnetic field sensor 56 is sensitive to X-axis external magnetic field 28 in a sensing direction (referred to herein as X sensing direction 64) parallel to X-axis 44 and therefore parallel to an X-Y plane 66 (see FIG. 4) of magnetic field sensor package 54 (FIG. 2). X-axis magnetic field sensor 56 produces an output signal 68, labeled $V_{X-OUT}$, indicative of the magnitude of X-axis external magnetic field 28.

X-axis magnetic field sensor 56 includes a sensor bridge, and more particularly, a Wheatstone bridge, referred to herein as an X-axis Wheatstone bridge 70. Thus, X-axis magnetic field sensor 56 includes first, second, third, and fourth sensor legs 72, 74, 76, 78, respectively. First sensor leg 72 includes one or more first magnetoresistive sense elements 80, second sensor leg 74 includes one or more second magnetoresistive sense elements 82, third sensor leg 76 includes one or more third magnetoresistive sense elements 84, and fourth sensor leg 78 includes one or more fourth magnetoresistive sense elements 86. In an embodiment, magnetoresistive sense elements 80, 82, 84, 86 may be MTJ structures. Only one each of magnetoresistive sense elements 80, 82, 84, 86 is shown for simplicity of illustration. Those skilled in the art will readily recognize that X-axis magnetic field sensor 56 can include any number of magnetoresistive sense elements 80, 82, 84, 86.

First and fourth magnetoresistive sense elements 80, 86 are coupled in series to form a first half of X-axis Wheatstone bridge 70 and second and third magnetoresistive sense elements 82, 84 are coupled in series to form a second half of X-axis Wheatstone bridge 70. Thus, the first half of X-axis Wheatstone bridge 70 is coupled in parallel with the second half of X-axis Wheatstone bridge 70 such that a junction 88 of first and second magnetoresistive sense elements 80, 82 forms a first input terminal 90 and a junction 92 of third and fourth magnetoresistive sense elements 84, 86 forms a second input terminal 94.

For illustrative purposes, resistances are provided in association with magnetoresistive sense elements 80, 82, 84, 86. In this example, a resistance 96, $R1_X$, represents the signal output of first magnetoresistive sense element 80. A resistance 98, $R2_X$, represents the signal output of second magnetoresistive sense element 82. A resistance 100, $R3_X$, represents the signal output of third magnetoresistive sense element 84. And, a resistance 102, $R4_X$, represents the signal output of fourth magnetoresistive sense element 86.

First magnetoresistive sense element 80 includes a first pinned layer 104 and a first sense layer 106 separated by an insulator layer 108. Similarly, second magnetoresistive sense element 82 includes a second pinned layer 110 and a second sense layer 112 separated by an insulator layer 114. Third magnetoresistive sense element 84 includes a third pinned layer 116 and a third sense layer 118 separated by an insulator layer 120. Fourth magnetoresistive sense element 86 includes a fourth pinned layer 122 and a fourth sense layer 124 separated by an insulator layer 126.

Additionally, X-axis magnetic sensor 56 includes a first permanent magnet layer 128 and a second permanent magnet layer 130 positioned proximate second and fourth magnetoresistive sense elements 82, 86 and located away from first and third magnetoresistive elements 80, 84. In this illustration, each of first and second permanent magnet layers 128, 130 is located out-of-plane from magnetoresistive sense elements 82, 86. For example, first permanent magnet layer 128 is located out-of-plane above second and fourth magnetoresistive sense elements 82, 86 and second permanent magnet layer 130 is located out-of plane below second and fourth magnetoresistive sense elements 82, 86. In other embodiments, first and second permanent magnet layers 128, 130 may be displaced out-of-plane relative to one another, but may be generally co-planar with magnetoresistive sense elements 82, 86. Further, although two permanent magnet layers 128, 130 are shown, alternative embodiments may include only one or more than two permanent magnet layers and may have different magnetic orientations.

As will be discussed below, first and second permanent magnet layers 128, 130 magnetically bias the sense magnetization of second and fourth magnetoresistive sense elements 82, 86. However, first and second permanent magnet layers 128, 130 are located at a distance away from first and third magnetoresistive sense elements 80, 84 to substantially prevent first and second permanent magnet layers 128, 130 from magnetically biasing the sense magnetization first and third magnetoresistive sense elements 80, 84. In order to enable the suitable out-of-plane biasing and to concurrently enable efficiency in fabrication, each of first and second permanent magnet layers 128, 130 has a single magnetic orientation, a single thickness, and a single spacing away from magnetoresistive sense elements 82, 86. In this example, a magnetic orientation 131 of first and second permanent magnet layers 128, 130 is substantially perpendicular to X-Y plane 66 (FIG. 4) of magnetic field sensor package 54 (FIG. 2). More specifically, magnetic orientation 131 is parallel to Z-axis 42 and is directed downward on the page.

Figure 4:
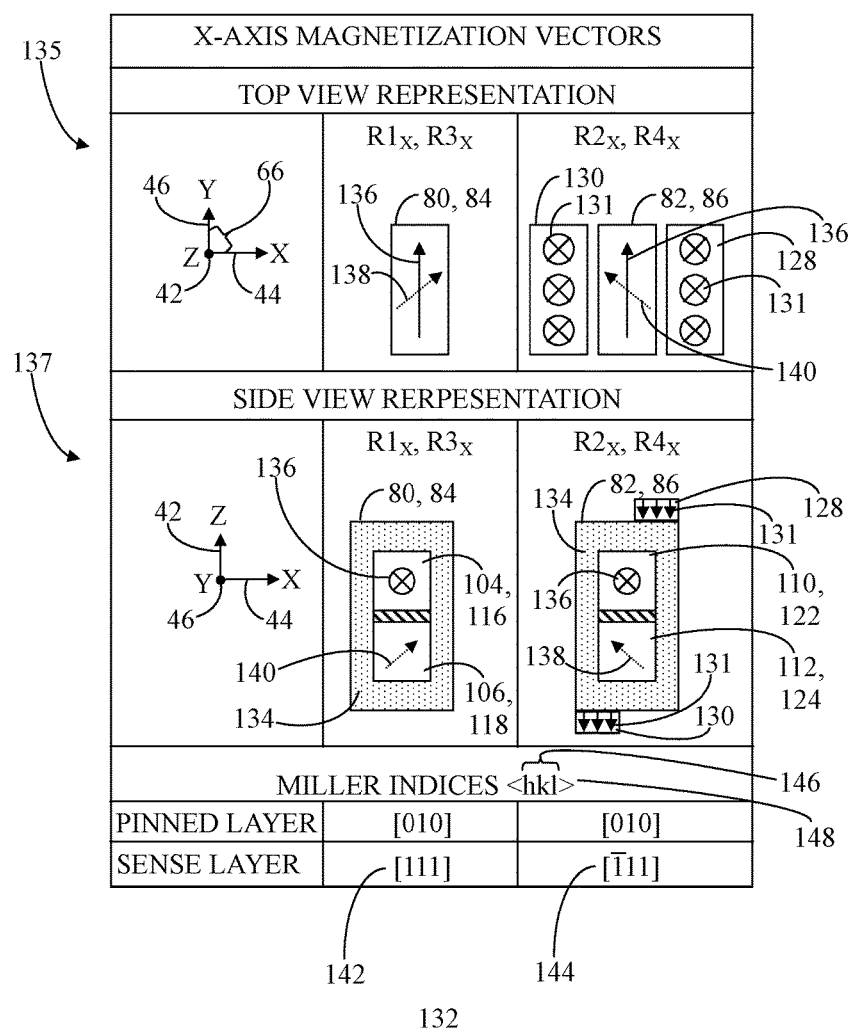
FIG. 4 shows a table demonstrating magnetization vectors of the X-axis magnetic field sensor.

Referring concurrently to FIGS. 3 and 4, FIG. 4 shows a table 132 demonstrating magnetization vectors of X-axis magnetic field sensor 56. More particularly, table 132 provides a top view representation 135 of magnetoresistive sense elements 80, 82, 84, 86 and a side view representation 137 of magnetoresistive sense elements 80, 82, 84, 86. Top view representation 135 includes symbol representing top views of first and third magnetoresistive sense elements 80, 84 and another symbol representing top views of second and fourth magnetoresistive sense elements 82, 86 with first and second permanent magnet layers 128, 130. Side view representation 137 provides a symbol representing side views of first and third magnetoresistive sense elements 80, 84 and another symbol representing side views of second and fourth magnetoresistive sense elements 82, 84. A dielectric material 134 surrounds magnetoresistive sense elements 80, 82, 84, 86. Dielectric material 134 is included with the side views representing first and third magnetoresistive sense elements 80, 84 as well as second and fourth magnetoresistive sense elements 82, 86 to illustrate an out-of-plane location of first and second permanent magnet layers 128, 130 relative to magnetoresistive sense elements 80, 82, 84, 86.

Each of first, second, third, and fourth pinned layers 104, 110, 116, 122 has a reference magnetization 136 oriented substantially parallel to X-Y plane 66. Further, reference magnetization 136 is oriented orthogonal to X sensing direction 64. Thus, as shown in FIG. 3 and in the side view of FIG. 4, reference magnetization 136 is represented by circles with an inscribed X, denoting a direction going into the page. As further shown in the top view of FIG. 4, reference magnetization 136 is represented by upwardly directed solid arrows aligned with Y-axis 46 for X-axis magnetic field sensor 56.

Each of first and third sense layers 106, 118 has a first sense magnetization 138 and each of second and fourth sense layers 112, 124 has a second sense magnetization 140. As shown in both FIGS. 3 and 4, first sense magnetization 138 and second sense magnetization 140 are represented by dotted arrows. The respective directions of each of first sense magnetization 138 and second sense magnetization 140 are skewed away from X-axis 44, Y-axis 46, and Z-axis 42. In general, first and second sense magnetizations 138, 140 are orientable in response to X magnetic field 28 in X sensing direction 64. In order to better appreciate these skewed directions of first and second sense magnetizations 138, 140, the orientation of each of first sense magnetization 138 and second sense magnetization 140 (as well as the orientation of reference magnetization 136) is defined herein by Miller indices.

Miller indices are a notation system typically used to specify directions and plane. For example, they can be used to specify a direction of a vector, r, from the origin to a point. Typically, the notation [hkl] represents the direction, where the Miller indices h, k, and l are replaced by three integers, and the notation <hkl> represents a family of directions. A negative direction is denoted with a bar on top of one or more of the three integers. In a cubic system, each of the directions in a family of directions has the same indices regardless of order or sign.

In accordance with an embodiment, first sense magnetization 138 is oriented in a first <hkl> direction 142, where h, k, and l are Miller indices 146 all of which are non-zero and <hkl> represents a family of directions 148. In the absence of external magnetic field (e.g., X magnetic field 28), first and second permanent magnet layers 128, 130 positioned proximate second and fourth magnetoresistive sense elements 82, 86 magnetically bias second sense magnetization 140 in a second <hkl> direction 144 relative to first <hkl> direction 142, where one of h, k, and l of second <hkl> direction 144 is a negative value of a corresponding one of h, k, and l in first <hkl> direction 142.

By way of example, first <hkl> direction 142 of first sense magnetization 138 for each of first and third magnetoresistive sense elements 80, 84 may be characterized by Miller indices of [111]. Second <hkl> direction 144 of second sense magnetization 140 for each of second and fourth magnetoresistive sense elements 82, 86 is therefore characterized by Miller indices of [$\bar{1}$11]. Utilizing the Miller index notation system, the orientation, or direction, of reference magnetization 136 for all of magnetoresistive sense elements 80, 82, 84, 86 can therefore be characterized by Miller indices of [010].

Accordingly, both of first <hkl> direction 142 and second <hkl> direction 144 of respective first and second sense magnetizations 138, 140 are skewed by the same angular magnitude, θ, away from each of X-axis 44, Y-axis 46, and Z-axis 42. However, second <hkl> direction 144 is skewed in an opposing direction from first <hkl> direction 142 relative the sensing axis, i.e., X-axis 44, by the negative of the angular magnitude, i.e., by negative θ. Conversely, the direction of reference magnetization 136 is parallel to plane 66 but perpendicular to X sensing direction 64. The skewed orientations of first and second sense magnetizations 138, 140 will be discussed further discussed in connection with FIG. 10.

Figure 5:
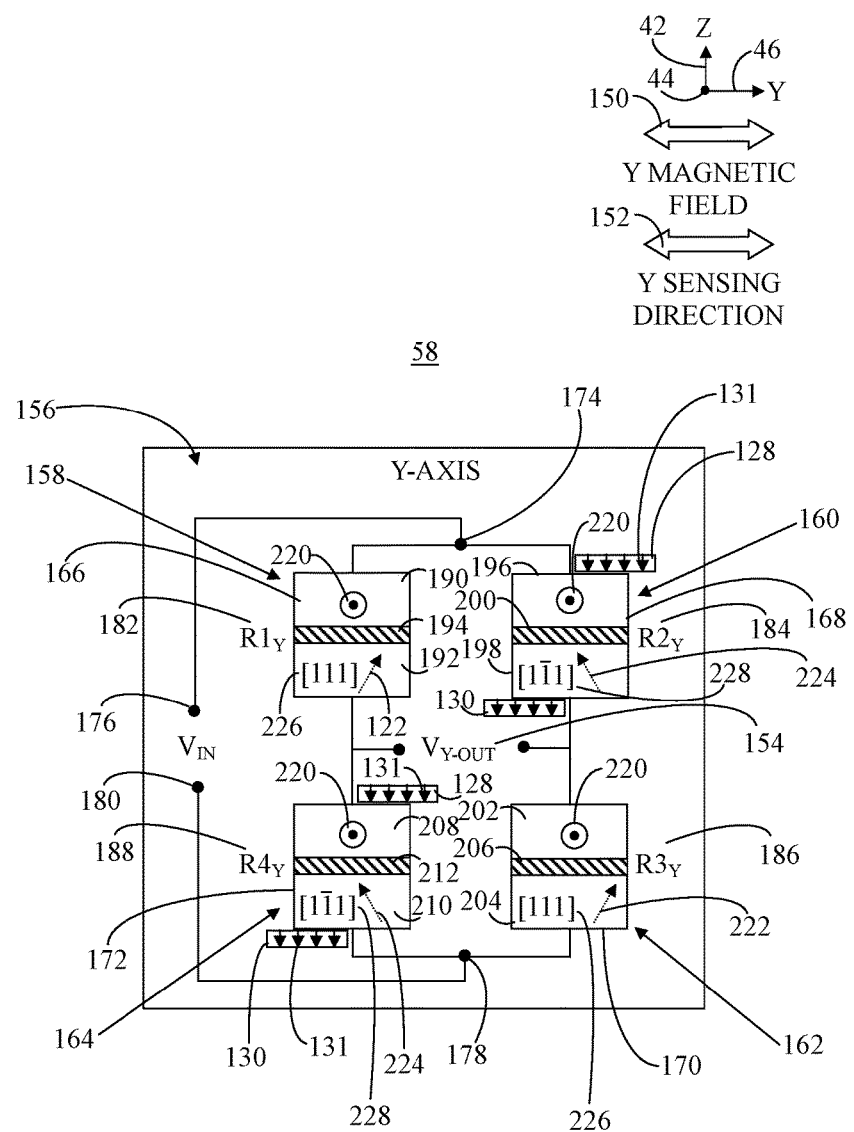
FIG. 5 shows a simplified schematic view of a Y-axis magnetic field sensor the magnetic field sensor package of FIG. 2.

Now referring to FIG. 5, FIG. 5 shows a simplified schematic view of Y-axis magnetic field sensor 58 of magnetic field sensor package 54 (FIG. 2). Accordingly, Y-axis magnetic field sensor 58 is sensitive to a Y-axis external magnetic field 150 in a sensing direction (referred to herein as Y sensing direction 152) parallel to Y-axis 46 and therefore parallel to an X-Y plane 66 (see FIG. 6) of magnetic field sensor package 54 (FIG. 2). Y-axis magnetic field sensor 58 produces an output signal 154, labeled $V_{Y\text{-}OUT}$, indicative of the magnitude of Y-axis external magnetic field 150.

Y-axis magnetic field sensor 58 includes a sensor bridge, and more particularly, a Wheatstone bridge, referred to herein as a Y-axis Wheatstone bridge 156. Thus, Y-axis magnetic field sensor 58 includes first, second, third, and fourth sensor legs 158, 160, 162, 164, respectively. First sensor leg 158 includes one or more first magnetoresistive sense elements 166, second sensor leg 160 includes one or more second magnetoresistive sense elements 168, third sensor leg 162 includes one or more third magnetoresistive sense elements 170, and fourth sensor leg 164 includes one or more fourth magnetoresistive sense elements 172. Only one each of magnetoresistive sense elements 166, 168, 170, 172 is shown for simplicity of illustration. Those skilled in the art will readily recognize that Y-axis magnetic field sensor 58 can include any number of magnetoresistive sense elements 166, 168, 170, 172.

First and fourth magnetoresistive sense elements 166, 172 are coupled in series to form a first half of Y-axis Wheatstone bridge 156 and second and third magnetoresistive sense elements 168, 170 are coupled in series to form a second half of Y-axis Wheatstone bridge 156. Thus, the first half of Y-axis Wheatstone bridge 156 is coupled in parallel with the second half of Y-axis Wheatstone bridge 156 such that a junction 174 of first and second magnetoresistive sense elements 166, 168 forms a first input terminal 176 and a junction 178 of third and fourth magnetoresistive sense elements 190 172 forms a second input terminal 180.

For illustrative purposes, resistances are provided in association with magnetoresistive sense elements 166, 168, 170, 172. In this example, a resistance 182, $R1_Y$, represents the signal output of first magnetoresistive sense element 166. A resistance 184, $R2_Y$, represents the signal output of second magnetoresistive sense element 168. A resistance 186, $R3_Y$, represents the signal output of third magnetoresistive sense element 170. And, a resistance 188, $R4_Y$, represents the signal output of fourth magnetoresistive sense element 172.

First magnetoresistive sense element 166 includes a first pinned layer 190 and a first sense layer 192 separated by an insulator layer 194. Similarly, second magnetoresistive sense element 168 includes a second pinned layer 196 and a second sense layer 198 separated by an insulator layer 200. Third magnetoresistive sense element 170 includes a third pinned layer 202 and a third sense layer 204 separated by an insulator layer 206. Fourth magnetoresistive sense element 172 includes a fourth pinned layer 208 and a fourth sense layer 210 separated by an insulator layer 212.

Additionally, Y-axis magnetic sensor 58 includes first permanent magnet layer 128 and second permanent magnet layer 130 positioned proximate second and fourth magnetoresistive sense elements 168, 172 and located away from first and third magnetoresistive elements 166, 170. In this illustration, each of first and second permanent magnet layers 128, 130 is located out-of-plane from magnetoresistive sense elements 168, 172. For example, first permanent magnet layer 128 is located out-of-plane above second and fourth magnetoresistive sense elements 168, 172 and second permanent magnet layer 130 is located out-of plane below second and fourth magnetoresistive sense elements 168, 172. As discussed above, first and second permanent magnet layers 128, 130 may alternatively be displaced out-of-plane relative to one another, but may be generally co-planar with magnetoresistive sense elements 168, 172. Further, although two permanent magnet layers 128, 130 are shown, alternative embodiments may include only one or more than two permanent magnet layers and may have other single magnetization directions.

First and second permanent magnet layers 128, 130 magnetically bias the sense magnetization of second and fourth magnetoresistive sense elements 168, 172. However, first and second permanent magnet layers 128, 130 are located at a distance away from first and third magnetoresistive sense elements 166, 170 to substantially prevent first and second permanent magnet layers 128, 130 from magnetically biasing the sense magnetization first and third magnetoresistive sense elements 166, 170. Again, magnetic orientation 131 of first and second permanent magnet layers 128, 130 is substantially perpendicular to X-Y plane 66 (FIG. 6) of magnetic field sensor package 54 (FIG. 2) and parallel to Z-axis 42.

Figure 6:
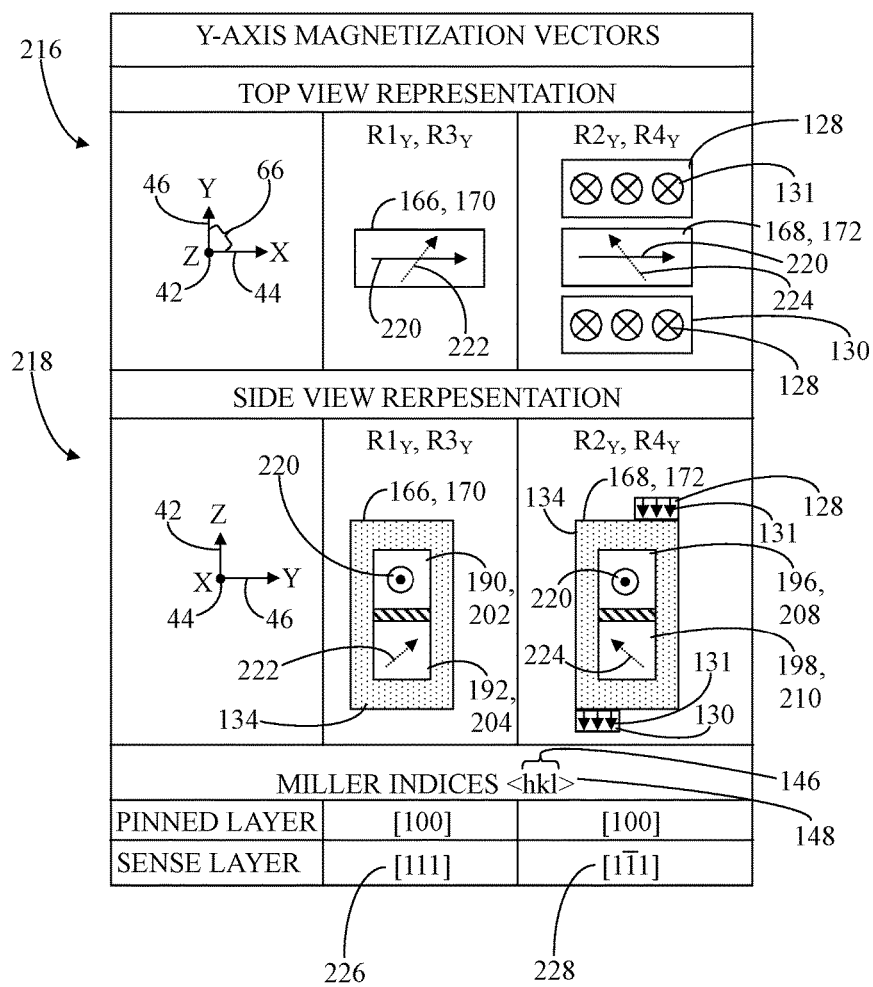
FIG. 6 shows a table demonstrating magnetization vectors of the Y-axis magnetic field sensor.

Referring concurrently to FIGS. 5 and 6, FIG. 6 shows a table 214 demonstrating magnetization vectors of Y-axis magnetic field sensor 58. More particularly, table 214 provides a top view representation 216 of magnetoresistive sense elements 166, 168, 170, 172 and a side view representation 218 of magnetoresistive sense elements 166, 168, 170, 172. Top view representation 216 includes a symbol representing top views of first and third magnetoresistive sense elements 166, 170 and another symbol representing top views of second and fourth magnetoresistive sense elements 168, 172 with first and second permanent magnet layers 128, 130. Side view representation 218 provides a symbol representing side views of first and third magnetoresistive sense elements 166, 170 and another symbol representing side views of second and fourth magnetoresistive sense elements 168, 172. Dielectric material 134 is included with the side views representing first and third magnetoresistive sense elements 166, 170 as well as second and fourth magnetoresistive sense elements 168, 172 to illustrate an out-of-plane location of first and second permanent magnet layers 128, 130 relative to magnetoresistive sense elements 166, 168, 170, 172.

Each of first, second, third, and fourth pinned layers 190, 196, 202, 208 has a reference magnetization 220 oriented substantially parallel to X-Y plane 66. Further, reference magnetization 222 is oriented orthogonal to Y sensing direction 152. Thus, as shown in FIG. 5 and in side view representation 218 of FIG. 6, reference magnetization 220 is represented by circles with an inscribed dot, denoting a direction coming out of the page. As further shown in top view representation 216 of FIG. 6, reference magnetization 220 is represented by horizontally directed solid arrows aligned with X-axis 44 for Y-axis magnetic field sensor 58.

Each of first and third sense layers 192, 204 has a first sense magnetization 222 and each of second and fourth sense layers 198, 210 has a second sense magnetization 224. As shown in both FIGS. 5 and 6, first sense magnetization 222 and second sense magnetization 224 are represented by dotted arrows. The respective directions of each of first sense magnetization 222 and second sense magnetization 224 are skewed away from X-axis 44, Y-axis 46, and Z-axis 42. In general, first and second sense magnetizations 222, 224 are orientable in response to Y magnetic field 150 in Y sensing direction 152. In order to better appreciate these skewed directions of first and second sense magnetizations 222, 224, the orientation of each of first sense magnetization 222 and second sense magnetization 224 (as well as the orientation of reference magnetization 220) is defined herein by Miller indices.

In accordance with an embodiment, first sense magnetization 222 is oriented in a first <hkl> direction 226. Again, h, k, and l are Miller indices 146 all of which are non-zero and <hkl> represents family of directions 148. In the absence of external magnetic field (e.g., Y magnetic field 150), first and second permanent magnet layers 128, 130 positioned proximate second and fourth magnetoresistive sense elements 168, 172 magnetically bias second sense magnetization 224 in a second <hkl> direction 228 relative to first <hkl> direction 226, where one of h, k, and l of second <hkl> direction 228 is a negative value of a corresponding one of h, k, and l in first <hkl> direction 226.

By way of example, first <hkl> direction 226 of first sense magnetization 222 for each of first and third magnetoresistive sense elements 166, 170 may be characterized by Miller indices of [111]. Second <hkl> direction 228 of second sense magnetization 224 for each of second and fourth magnetoresistive sense elements 168, 172 is therefore characterized by Miller indices of [1$\bar{1}$1]. Utilizing the Miller index notation system, the orientation, or direction, of reference magnetization 220 of pinned layers 190, 196, 202, 208 for all of magnetoresistive sense elements 166, 168, 170, 172 can therefore be characterized by Miller indices of [100].

Accordingly, both of first <hkl> direction 226 and second <hkl> direction 228 of respective first and second sense magnetizations 222, 224 are skewed by the same angular magnitude, θ, away from each of X-axis 44, Y-axis 46, and Z-axis 42. However, second <hkl> direction 228 is skewed in an opposing direction from first <hkl> direction 226 relative the sensing axis, i.e., Y-axis 46, by the negative of the angular magnitude, i.e., by negative θ. Conversely, the direction of reference magnetization 220 is parallel to plane 66 but perpendicular to Y sensing direction 152. This skewed orientation will be discussed further discussed in connection with FIG. 10.

Figure 7:
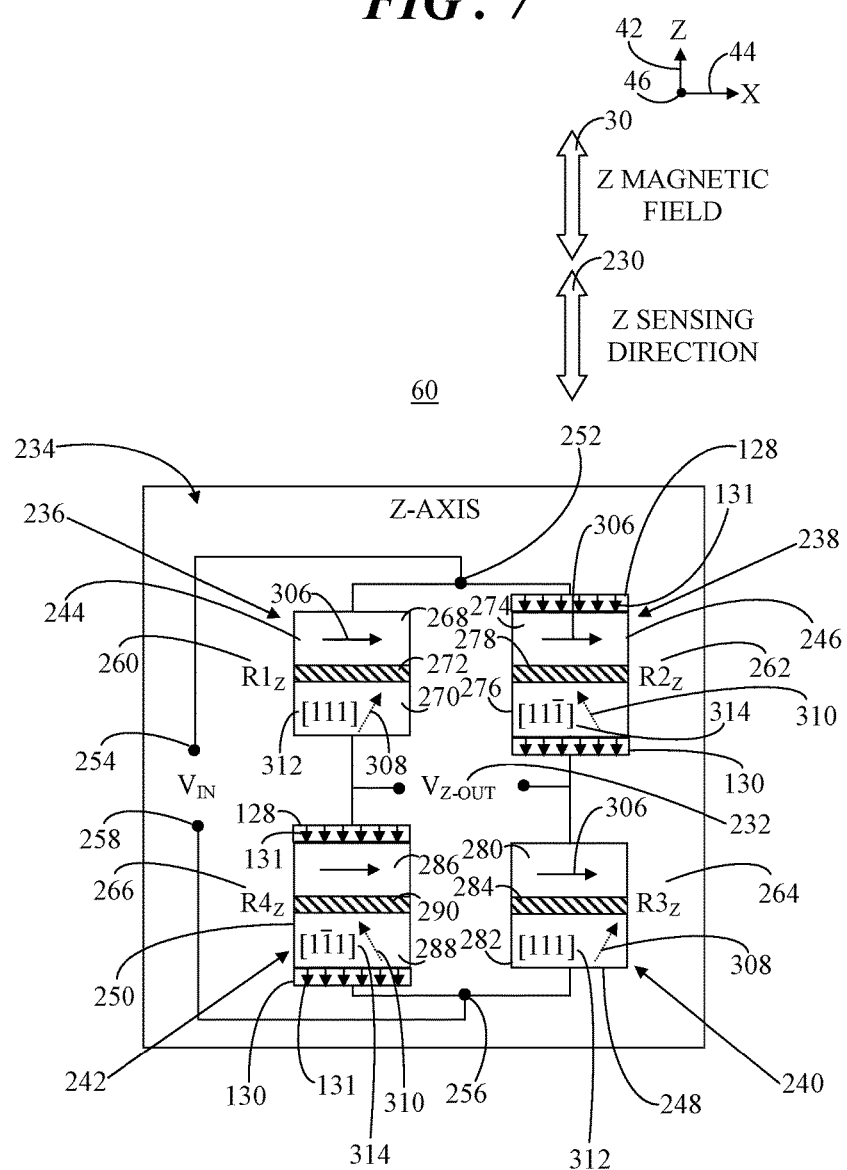
FIG. 7 shows a simplified schematic view of a Z-axis magnetic field sensor the magnetic field sensor package of FIG. 2.

Now referring to FIG. 7, FIG. 7 shows a simplified schematic view of Z-axis magnetic field sensor 60 of magnetic field sensor package 54 (FIG. 2). Accordingly, Z-axis magnetic field sensor 60 is sensitive to Z-axis external magnetic field 30 in a sensing direction (referred to herein as a Z sensing direction 230) parallel to Z-axis 42 and therefore perpendicular to X-Y plane 66 (see FIG. 8) of magnetic field sensor package 54. Z-axis magnetic field sensor 60 produces an output signal 232, labeled $V_{Z\text{-}OUT}$, indicative of the magnitude of Z-axis external magnetic field 30.

Z-axis magnetic field sensor 60 includes a sensor bridge, and more particularly, a Wheatstone bridge, referred to herein as a Z-axis Wheatstone bridge 234. Thus, Z-axis magnetic field sensor 60 includes first, second, third, and fourth sensor legs 236, 238, 240, 242, respectively. First sensor leg 236 includes one or more first magnetoresistive sense elements 244, second sensor leg 238 includes one or more second magnetoresistive sense elements 246, third sensor leg 240 includes one or more third magnetoresistive sense elements 248, and fourth sensor leg 242 includes one or more fourth magnetoresistive sense elements 250. Only one each of magnetoresistive sense elements 244, 246, 248, 250 is shown for simplicity of illustration. Those skilled in the art will readily recognize that Z-axis magnetic field sensor 60 can include any number of magnetoresistive sense elements 244, 246, 248, 250.

First and fourth magnetoresistive sense elements 244, 250 are coupled in series to form a first half of Z-axis Wheatstone bridge 234 and second and third magnetoresistive sense elements 246, 248 are coupled in series to form a second half of Z-axis Wheatstone bridge 234. Thus, the first half of Z-axis Wheatstone bridge 234 is coupled in parallel with the second half of Z-axis Wheatstone bridge 234 such that a junction 252 of first and second magnetoresistive sense elements 244, 246 forms a first input terminal 254 and a junction 256 of third and fourth magnetoresistive sense elements 248, 250 forms a second input terminal 258.

For illustrative purposes, resistances are provided in association with magnetoresistive sense elements 244, 246, 248, 250. In this example, a resistance 260, $R1_Z$, represents the signal output of first magnetoresistive sense element 244. A resistance 262, $R2_Z$, represents the signal output of second magnetoresistive sense element 246. A resistance 264, $R3_Z$, represents the signal output of third magnetoresistive sense element 248. And, a resistance 266, $R4_Z$, represents the signal output of fourth magnetoresistive sense element 250.

First magnetoresistive sense element 244 includes a first pinned layer 268 and a first sense layer 270 separated by an insulator layer 272. Similarly, second magnetoresistive sense element 246 includes a second pinned layer 274 and a second sense layer 276 separated by an insulator layer 278. Third magnetoresistive sense element 248 includes a third pinned layer 280 and a third sense layer 282 separated by an insulator layer 284. Fourth magnetoresistive sense element 250 includes a fourth pinned layer 286 and a fourth sense layer 288 separated by an insulator layer 290.

Additionally, Z-axis magnetic sensor 60 includes first permanent magnet layer 128 and second permanent magnet layer 130 positioned proximate second and fourth magnetoresistive sense elements 246, 250 and located away from first and third magnetoresistive elements 244, 248. In this illustration, each of first and second permanent magnet layers 128, 130 is located out-of-plane from magnetoresistive sense elements 246, 250. For example, first permanent magnet layer 128 is located out-of-plane above second and fourth magnetoresistive sense elements 246, 250 and second permanent magnet layer 130 is located out-of plane below second and fourth magnetoresistive sense elements 246, 250. As discussed above, first and second permanent magnet layers 128, 130 may alternatively be displaced out-of-plane relative to one another, but may be generally co-planar with magnetoresistive sense elements 246, 250. Further, although two permanent magnet layers 128, 130 are shown, alternative embodiments may include only one or more than two permanent magnet layers and with different magnetization directions.

First and second permanent magnet layers 128, 130 magnetically bias the sense magnetization of second and fourth magnetoresistive sense elements 246, 250. However, first and second permanent magnet layers 128, 130 are located at a distance away from first and third magnetoresistive sense elements 244, 248 to substantially prevent first and second permanent magnet layers 128, 130 from magnetically biasing the sense magnetization first and third magnetoresistive sense elements 244, 248. Again, magnetic orientation 131 of first and second permanent magnet layers 128, 130 is substantially perpendicular to X-Y plane 66 (FIG. 6) of magnetic field sensor package 54 (FIG. 2) and parallel to Z-axis 42.

Figure 8:
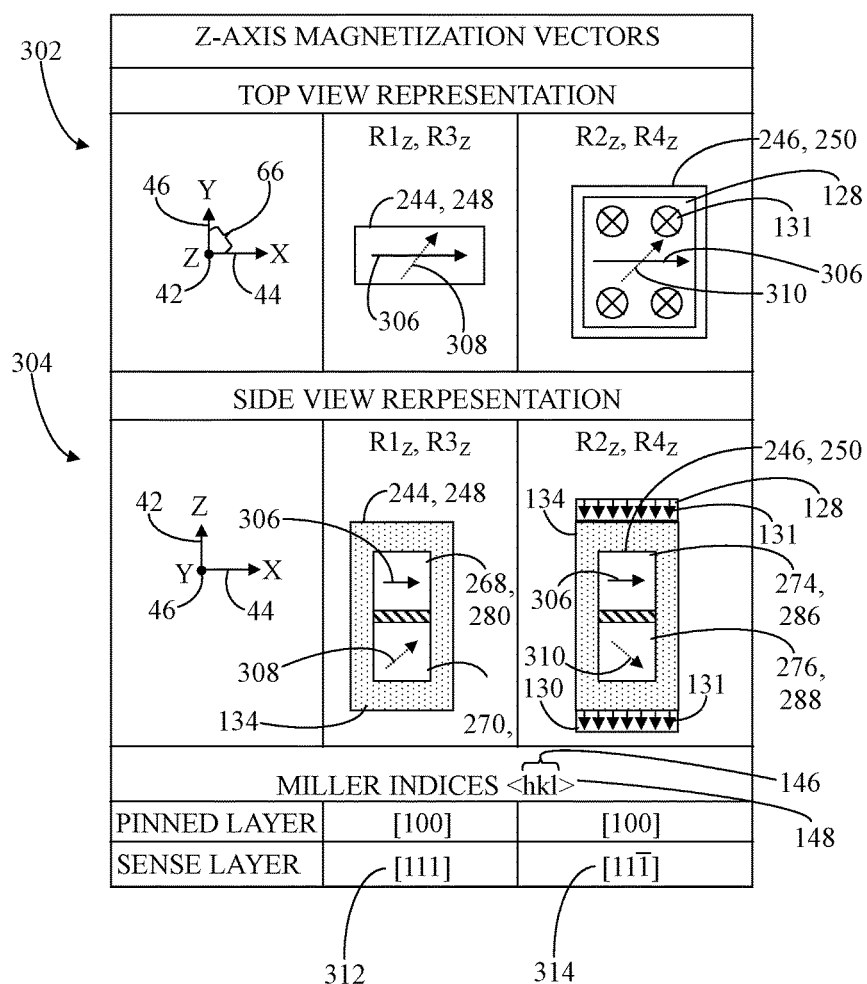
FIG. 8 shows a table demonstrating magnetization vectors of the Z-axis magnetic field.

Referring concurrently to FIGS. 7 and 8, FIG. 8 shows a table 300 demonstrating magnetization vectors of Z-axis magnetic field sensor 60. More particularly, table 300 provides a top view representation 302 of magnetoresistive sense elements 244, 246, 248, 250 and a side view representation 304 of magnetoresistive sense elements 244, 246, 248, 250. Top view representation 302 includes a symbol representing top views of first and third magnetoresistive sense elements 244, 248 and another symbol representing top views of second and fourth magnetoresistive sense elements 246, 250 with first permanent magnet layer 128 overlying second and fourth magnetoresistive sense elements 246, 250. Side view representation 304 provides a symbol representing side views of first and third magnetoresistive sense elements 244, 248 and another symbol representing side views of second and fourth magnetoresistive sense elements 246, 250. Dielectric material 134 is included with the side views representing first and third magnetoresistive sense elements 244, 248 as well as second and fourth magnetoresistive sense elements 246, 250 to illustrate an out-of-plane location of first and second permanent magnet layers 128, 130 relative to magnetoresistive sense elements 244, 246, 248, 250.

Each of first, second, third, and fourth pinned layers 268, 274, 280, 286 has a reference magnetization 306 oriented substantially parallel to X-Y plane 66. Further, reference magnetization 306 is oriented parallel to X-axis 44 and therefore orthogonal to Z sensing direction 230. Thus, as shown in FIG. 7 and FIG. 8, reference magnetization 306 is represented by horizontally directed solid arrows aligned with X-axis 44 for Z-axis magnetic field sensor 60.

Each of first and third sense layers 270, 282 has a first sense magnetization 308 and each of second and fourth sense layers 276, 288 has a second sense magnetization 310. As shown in both FIGS. 7 and 8, first sense magnetization 308 and second sense magnetization 310 are represented by dotted arrows. The respective directions of each of first sense magnetization 308 and second sense magnetization 310 are skewed away from X-axis 44, Y-axis 46, and Z-axis 42. In general, first and second sense magnetizations 308, 310 are orientable in response to Z magnetic field 30 in Z sensing direction 230. In order to better appreciate these skewed directions of first and second sense magnetizations 308, 310, the orientation of each of first sense magnetization 308 and second sense magnetization 310 (as well as the orientation of reference magnetization 306) is defined herein by Miller indices.

In accordance with an embodiment, first sense magnetization 308 is oriented in a first <hkl> direction 312. Again, h, k, and l are Miller indices 146 all of which are non-zero and <hkl> represents family of directions 148. In the absence of external magnetic field (e.g., X magnetic field 30), first and second permanent magnet layers 128, 130 positioned proximate second and fourth magnetoresistive sense elements 246, 250 magnetically bias second sense magnetization 310 in a second <hkl> direction 314 relative to first <hkl> direction 312, where one of h, k, and l of second <hkl> direction 314 is a negative value of a corresponding one of h, k, and l in first <hkl> direction 312.

By way of example, first <hkl> direction 312 of first sense magnetization 308 for each of first and third sense layers 270, 282 of corresponding first and third magnetoresistive sense elements 244, 248 may be characterized by Miller indices of [111]. Second <hkl> direction 314 of second sense magnetization 310 for each of second and fourth sense layers 276, 288 of corresponding second and fourth magnetoresistive sense elements 246, 250 is therefore characterized by Miller indices of [11$\bar{1}$]. Utilizing the Miller index notation system, the orientation, or direction, of reference magnetization 306 of pinned layers 268, 274, 280, 286 for all of magnetoresistive sense elements 244, 246, 248, 250 can therefore be characterized by Miller indices of [100].

Accordingly, both of first <hkl> direction 312 and second <hkl> direction 314 of respective first and second sense magnetizations 308, 310 are skewed by the same angular magnitude, θ, away from each of X-axis 44, Y-axis 46, and Z-axis 42. However, second <hkl> direction 314 is skewed in an opposing direction from first <hkl> direction 312 relative the sensing axis, i.e., Z-axis 42, by the negative of the angular magnitude, i.e., by negative θ. Conversely, the direction of reference magnetization 306 is parallel to plane 66 but perpendicular to Z sensing direction 30. Again, this skewed orientation will be discussed further discussed in connection with FIG. 10.

Figure 9:
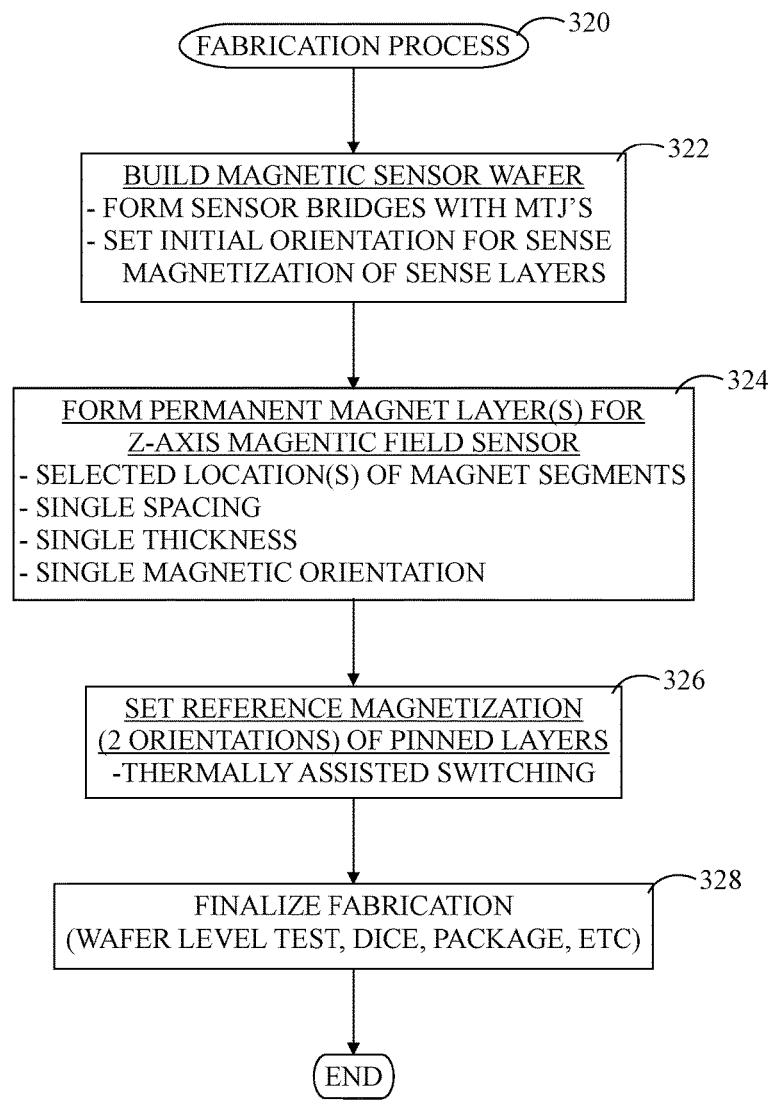
FIG. 9 shows a flowchart of a fabrication process for manufacturing the magnetic field sensor of FIG. 2.

FIG. 9 shows a flowchart of a fabrication process 320 in accordance with another embodiment. Fabrication process 320 is described in connection with the fabrication of magnetic field sensor package 54 (FIG. 2) having three sense axes (e.g., X-axis, Y-axis, Z-axis magnetic field sensors 56,

58, 60). However, fabrication process 320 may be readily adapted to produce a single or dual sense axis magnetic field sensor.

Those skilled in the art will recognize that fabrication process 320 is exemplary in nature. Thus, only the primary operations of fabrication process 320 are discussed herein for simplicity. Furthermore, the process blocks depicted in FIG. 9 may be performed in parallel with each other or with performing other processes, and each process block will include many separate process steps. In addition, it is to be understood that the particular ordering of the process blocks depicted in FIG. 9 may be modified while achieving substantially the same result. Accordingly, such modifications are intended to be included within the scope of the inventive subject matter.

At a process block 322, a magnetic sensor wafer is built, i.e., fabricated, utilizing known methodologies to produce a plurality of sensor bridges (e.g., X-axis Wheatstone bridge 70 of FIG. 3, Y-axis Wheatstone bridge 156 of FIG. 5, and Z-axis Wheatstone bridge 234 of FIG. 7). Each of the sensors bridges are thus fabricated to include four sensor legs, with each sensor leg having one or more magnetoresistive sense elements, e.g., MTJ's. Furthermore, the magnetoresistive sense elements can be fabricated so that the magnetoresistive sense elements are formed in a common plane (i.e., they are arranged in-plane) relative to one another within a dielectric material with suitable electrically conductive interconnections.

Fabrication of the magnetic sense wafer concurrently entails setting (i.e., self-biasing) the initial orientation of the sense magnetization of each of the sense layers of each of the magnetoresistive sense elements. In some embodiments, the sense layer may include a sense ferromagnetic layer and a non-magnetic layer. The sense ferromagnetic layer of sense layer may include any one of Co, Fe, Ni, or an alloy comprising any one or a combination of these elements. The non-magnetic layer may include any one of Pt, Pd, Ta, Hf, Nb, Cr, V, Cu, Au, Ti, Ag, Ru, W, or an alloy comprising any one or a combination of these elements. Through the material properties of the sense ferromagnetic layer and non-magnetic layer of sense layer, the sense magnetizations of the various sense layers of the magnetoresistive sense elements may be suitably self-biased in the single direction. Other embodiments may employ "growing in" or otherwise treating the sense layer, and/or by shape anisotropy so that the sense magnetization of each of the sense layers, in the absence of an external magnetic field and in the absence of the permanent magnet layers described above, will be in skewed direction as characterized above by the Miller indices [111].

At a process block 324, one or more permanent magnet layers (e.g., first and second permanent magnet layers 128. 130 of FIGS. 3, 5, and 7) is suitably formed in order to magnetically bias the sense magnetization of the second and fourth magnetoresistive sense elements of each of the Wheatstone bridges, in the absence of an external magnetic field. Considerations for biasing the sense magnetization include selecting locations at which segments of the permanent magnet layers will be positioned, a single out-of-plane spacing of the magnet segments from the second and fourth magnetoresistive elements, a single thickness of the permanent magnet layer(s), and a single magnetic orientation (e.g., the out-of-plane magnetic). Formation of the permanent magnet layer(s) may entail deposition, patterning, and etching of a suitable material to form the magnet segments. Such material may include iron, nickel, cobalt, some alloys of rare earth materials or an alloy comprising any one or a combination of these elements that is magnetized and creates its own persistent magnetic field. Preferably, the permanent magnet layer(s) is formed from a magnetically "hard" material that is subjected to processing in a powerful magnetic field during manufacture to align its internal microcrystalline structure, so as to make it very difficult to demagnetize.

At a process block 320, the reference magnetization of the pinned layers of each of the magnetoresistive sense elements is set. In some embodiments, each magnetic field sensor may be programmed by setting the reference magnetization of the magnetoresistive sense elements in the predetermined direction in the X-Y plane of pinned layer. A programming operation may be thermally assisted (e.g., a thermally assisted switching process) wherein the programming operation includes heating selected ones of the MTJ magnetoresistive sense elements to a high temperature threshold. In such a situation, the magnetoresistive sense elements may include an antiferromagnetic layer (not shown) that pins the reference magnetization of the pinned layers at a low temperature threshold and frees the reference magnetization of the pinned layers at the high temperature threshold. Heating the selected magnetoresistive sense elements at the high temperature threshold may be performed by passing a heating current in the selected magnetoresistive sense elements via a current line (not shown). Other techniques may be implemented to provide localized heating, such as from a separate adjacent current line, by using a laser or other radiative source, and so forth. After switching the reference magnetization to the desired fixed magnetization orientation, the selected magnetoresistive sense elements can be cooled to the low temperature threshold to pin, or fix, the reference magnetization in the switched state. Other embodiments may employ existing or upcoming techniques for pinning the reference magnetization to a desired magnetization orientation so as to achieve the multiple fixed orientations of the reference magnetization of the pinned layer of magnetoresistive sense elements.

In accordance with an embodiment, two orientations of the reference magnetization may be set. A single orientation of reference magnetization 136 (FIG. 3) for X-axis magnetic field sensor 56 and reference magnetization 306 (FIG. 7) for Z-axis magnetic field sensor 60 is aligned with X-axis 44. Additionally, a single orientation of reference magnetization 220 (FIG. 5) for Y-axis magnetic field sensor 58 is aligned with Y-axis 46.

At a process block 328, fabrication of the magnetic sensor wafer continues with fabrication finalization processes such was wafer level testing, dicing, packaging, and the like. Thereafter, fabrication process 320 ends.

FIG. 10 shows an exemplary Wheatstone bridge configuration 330 with an accompanying plot 332 of a zero-offset outcome 334 resulting from any of the X-axis Wheatstone bridge 70 (FIG. 3), Y-axis Wheatstone bridge 156 (FIG. 5), and Z-axis Wheatstone bridge 234 (FIG. 7). In a conventional Wheatstone bridge circuit, a null (i.e., zero) output will occur with a zero applied external magnetic field whenever $R1_i$ equals $R2_i$ and $R3_i$ equals $R4_i$ so that $R1_i/R3_i$ equals $R2_i/R4_i$. However, when $R1_i$ does not equal $R2_i$ and $R3_i$ does not equal $R4_i$, a zero-field offset will occur. A zero-field offset is defined herein as an output voltage of a Wheatstone bridge that is not zero in the absence of an external magnetic field. This non-zero output, in the absence of an external magnetic field, can increase the complexity of the design of interface electronics associated with such a Wheatstone bridge and can degrade noise performance.

The ideal baseline (in the absence of an external magnetic field) condition of the differential Wheatstone bridge configuration 330 (representing any of X-axis Wheatstone bridge 70, Y-axis Wheatstone bridge 156, and Z-axis Wheatstone bridge) is a single resistance (i.e., uniform) balanced bridge in which all four resistances have identical values ($R1_i=R2_i=R3_i=R4_i$). The balanced bridge design occurs because the corresponding first and second sense magnetizations are skewed by the same angular magnitude, θ, away from the desired sense axis in opposing directions (i.e., positive θ and negative θ). This balanced bridge design results in an equal split of the bias voltage ($V_{IN}$) within both halves of Wheatstone bridge configuration 330 such that in the absence of an external magnetic field the output ($Y_{i\text{-}OUT}$) of Wheatstone bridge configuration 330 is identically zero.

In an embodiment, for each of the resistances $R1_i$, $R2_i$, $R3_i$, and $R4_i$, the skew angles between the reference magnetization of the pinned layers and the sense magnetization of the sense layers is equal to the following: $\cos^{-1}(1/\sqrt{3})=54.7°$ for each of $R1_i$, $R2_i$, $R3_i$, and $R4_i$. This places each resistance $R1_i$, $R2_i$, $R3_i$, and $R4_i$ at exactly the same operating point 334 on the magnetic tunnel junction (MTJ) output characteristics as illustrated in plot 332.

Thus, embodiments disclosed herein entail a magnetic field sensor capable of sensing magnetic fields along one or more mutually exclusive sense axes, typically referred to as the X-axis, Y-axis, and Z-axis. An embodiment of a magnetic field sensor comprises a sensor bridge having a first leg and a second leg. A first magnetoresistive sense element is formed in the first leg and located in a plane of the magnetic field sensor. The first magnetoresistive sense element includes a first pinned layer and a first sense layer, the first sense layer having a first sense magnetization oriented in a first <hkl> direction, wherein h, k, and l are Miller indices all of which are non-zero and <hkl> represents a family of directions. A second magnetoresistive sense element is formed in the second leg and located in the plane of the magnetic field sensor. The second magnetoresistive sense element includes a second pinned layer and a second sense layer. The first and second magnetoresistive sense elements are sensitive to an external magnetic field along a sensing direction, wherein each of the first and second pinned layers has a reference magnetization oriented substantially parallel to the plane and the second sense layer has a second sense magnetization. A permanent magnet layer is positioned proximate the second magnetoresistive sense element, wherein in the absence of the external magnetic field, the permanent magnet layer magnetically biases the second sense magnetization in a second <hkl> direction relative to the first <hkl> direction, wherein one of the h, k, and l of the second <hkl> direction is a negative value of a corresponding one of the h, k, and l of the first <hkl> direction.

Accordingly, a unique sensor bridge design of magnetoresistive sense elements is implemented for each sense axis. Each sensor bridge incorporates an in-plane orientation of reference magnetization of the pinned layer, along with out-of-plane, skewed biasing of the sense magnetization of the sense layer in two opposing directions. For each sensor bridge, one or more permanent magnet layers are strategically patterned (shape and position) to generate a unique external bias field vector of the sense magnetization of the sense layer to produce a balanced bridge configuration of magnetoresistive sense elements for the sensor bridge without built-in, non-zero magnetic field offset. Additionally, one sensor bridge design is utilized for sensing an external magnetic field that is perpendicular to the plane of the magnetic field sensor package without the use of flux concentrators. The strategically patterned permanent magnet layer(s) for this sense bridge additionally allows it to respond to the out-of-plane external magnetic field without inter-axis coupling of sensor response. The various inventive concepts and principles embodied herein enable an ultra low power, multiple sense axis magnetic field sensor without detrimental perming effects for improved sensitivity, reliability, and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
   a sensor bridge having a first leg and a second leg;
   a first magnetoresistive sense element formed in said first leg and located in a plane of said magnetic field sensor, said first magnetoresistive sense element including a first pinned layer and a first sense layer, said first sense layer having a first sense magnetization oriented in a first <hkl> direction, wherein h, k, and l are Miller indices all of which are non-zero and <hkl> represents a family of directions;
   a second magnetoresistive sense element formed in said second leg and located in said plane of said magnetic field sensor, said second magnetoresistive sense element including a second pinned layer and a second sense layer, said first and second magnetoresistive sense elements being sensitive to an external magnetic field along a sensing direction, wherein each of said first and second pinned layers has a reference magnetization oriented substantially parallel to said plane and said second sense layer has a second sense magnetization; and
   a permanent magnet layer positioned proximate said second magnetoresistive sense element, wherein in the absence of said external magnetic field, said permanent magnet layer magnetically biases said second sense magnetization in a second <hkl> direction relative to said first <hkl> direction, wherein one of said h, k, and l of said second <hkl> direction is a negative value of a corresponding one of said h, k, and l of said first <hkl> direction.

2. The magnetic field sensor of claim 1 wherein said permanent magnet layer is located away from said first magnetoresistive sense element to substantially prevent said permanent magnet layer from magnetically biasing said first sense magnetization of said first sense layer of said first magnetoresistive sense element.

3. The magnetic field sensor of claim 1 wherein:
   said first <hkl> direction of said first sense magnetization of said first magnetoresistive sense element is characterized by said Miller indices of [111]; and said second <hkl> direction of said second sense magnetization of said second magnetoresistive sense element is characterized by said Miller indices of [$\bar{1}$11].

4. The magnetic field sensor of claim 1 wherein:
said first <hkl> direction of said first sense magnetization of said first magnetoresistive sense element is characterized by said Miller indices of [111]; and
said second <hkl> direction of said second sense magnetization of said second magnetoresistive sense element is characterized by said Miller indices of [1$\bar{1}$1].

5. The magnetic field sensor of claim 1 wherein:
said first <hkl> direction of said first sense magnetization of said first magnetoresistive sense element is characterized by said Miller indices of [111]; and
said second <hkl> direction of said second sense magnetization of said second magnetoresistive sense element is characterized by said Miller indices of [11$\bar{1}$].

6. The magnetic field sensor of claim 1 wherein said reference magnetization of each of said first and second pinned layers is oriented in the same direction substantially parallel said plane.

7. The magnetic field sensor of claim 6 wherein said reference magnetization of said each of said first and second pinned layers is oriented orthogonal to said sensing direction.

8. The magnetic field sensor of claim 1 wherein said sensor bridge further comprises:
a third leg having a third magnetoresistive sense element formed therein, said third magnetoresistive sense element including a third pinned layer and a third sense layer; and
a fourth leg having a fourth magnetoresistive sense element formed therein, said fourth magnetoresistive sense element including a fourth pinned layer and a fourth sense layer, wherein:
said first, second, third, and fourth legs are coupled as a Wheatstone bridge such that said first and fourth magnetoresistive sense elements are coupled in series to form a first half of said Wheatstone bridge, said second and third magnetoresistive sense elements are coupled in series to form a second half of said Wheatstone bridge, said first half of said Wheatstone bridge is coupled in parallel with said second half of said Wheatstone bridge such that a first junction of said first and second magnetoresistive sense elements forms a first input terminal and a second junction of said third and fourth magnetoresistive sense elements forms a second input terminal;
said reference magnetization of each of said first, second, third, and fourth pinned layers of each of said first and third magnetoresistive sense elements is oriented in the same direction substantially parallel to said plane;
said third sense layer of said third magnetoresistive sense element has a third sense magnetization oriented in said first <hkl> direction; and
said permanent magnet layer is positioned proximate said fourth magnetoresistive sense element, said permanent magnet layer magnetically biasing a fourth sense magnetization of said fourth sense layer in said second <hkl> direction.

9. The magnetic field sensor of claim 8 wherein said permanent magnet layer is located away from said third magnetoresistive sense element to substantially prevent said permanent magnet layer from magnetically biasing said sense magnetization of said third sense layer of said third magnetoresistive sense element.

10. The magnetic field sensor of claim 1 wherein said permanent magnet layer is characterized by a single magnetic orientation.

11. The magnetic field sensor of claim 1 wherein said permanent magnet layer is a first permanent magnet layer and said magnetic field sensor further comprises a second permanent magnet layer vertically displaced away from said first permanent magnet layer and positioned proximate said second magnetoresistive sense element, wherein said first and second permanent magnet layers function cooperatively to magnetically bias said second sense magnetization of said second magnetoresistive sense element in said second <hkl> direction.

12. The magnetic field sensor of claim 1 wherein said sensor bridge is a first sensor bridge, said sensing direction is a first sensing direction, and said magnetic field sensor further comprises:
a second sensor bridge having a third leg and a fourth leg;
a third magnetoresistive sense element formed in said third leg and located in said plane of said magnetic field sensor, said third magnetoresistive sense element including a third pinned layer and a third sense layer, said third sense layer having a third sense magnetization oriented in said first <hkl> direction;
a fourth magnetoresistive sense element formed in said fourth leg and located in said plane of said magnetic field sensor, said fourth magnetoresistive sense element including a fourth pinned layer and a fourth sense layer, said third and fourth magnetoresistive sense elements being sensitive to an external magnetic field along a second sensing direction that is orthogonal to said first sensing direction, wherein each of said third and fourth pinned layers has said reference magnetization oriented substantially parallel to said plane; and
said permanent magnet layer is positioned proximate said fourth magnetoresistive sense element, said permanent magnet layer magnetically biasing a fourth sense magnetization of said fourth sense layer in a third <hkl> direction.

13. The magnetic field sensor of claim 12 further comprising:
a third sensor bridge having a fifth leg and a sixth leg;
a fifth magnetoresistive sense element formed in said fifth leg and located in said plane of said magnetic field sensor, said fifth magnetoresistive sense element including a fifth pinned layer and a fifth sense layer, said fifth sense layer having a fifth sense magnetization oriented in said first <hkl> direction;
a sixth magnetoresistive sense element formed in said sixth leg and located in said plane of said magnetic field sensor, said sixth magnetoresistive sense element including a sixth pinned layer and a sixth sense layer, said fifth and sixth magnetoresistive sense elements being sensitive to an external magnetic field along a third sensing direction that is orthogonal to each of said first and second sensing directions, wherein each of said fifth and sixth pinned layers has said reference magnetization oriented substantially parallel to said plane; and
said permanent magnet layer is positioned proximate sixth magnetoresistive sense element, said permanent magnet layer magnetically biasing a sixth sense magnetization of said sixth sense layer in a fourth <hkl> direction.

14. The magnetic field sensor of claim 13 wherein:
said first <hkl> direction of said first, third, and fifth sense magnetizations of corresponding ones of said first, third, and fifth magnetoresistive sense elements is characterized by said Miller indices of [111];

said second <hkl> direction of said second sense magnetization of said second magnetoresistive sense element is characterized by said Miller indices of [$\bar{1}$11];

said fourth <hkl> direction of said fourth sense magnetization of said fourth magnetoresistive sense element is characterized by said Miller indices of [1$\bar{1}$1]; and said sixth <hkl> direction of said sixth sense magnetization of said sixth magnetoresistive sense element is characterized by said Miller indices of [11$\bar{1}$].

15. A magnetic field sensor comprising:
a sensor bridge having a first leg, a second leg, a third leg, and a fourth leg;
a first magnetoresistive sense element formed in said first leg and located in a plane of said magnetic field sensor, said first magnetoresistive sense element including a first pinned layer and a first sense layer, said first pinned layer having a reference magnetization, and said first sense layer having a first sense magnetization;
a second magnetoresistive sense element formed in said second leg and located in said plane of said magnetic field sensor, said second magnetoresistive sense element including a second pinned layer and a second sense layer, said second pinned layer having said reference magnetization, and said second sense layer having a second sense magnetization;
a third magnetoresistive sense element formed in said third leg and located in a plane of said magnetic field sensor, said third magnetoresistive sense element including a third pinned layer and a third sense layer, said third pinned layer having said reference magnetization, and said third sense layer having a third sense magnetization;
a fourth magnetoresistive sense element formed in said fourth leg and located in a plane of said magnetic field sensor, said fourth magnetoresistive sense element including a fourth pinned layer and a fourth sense layer, said fourth pinned layer having said reference magnetization, and said fourth sense layer having a fourth sense magnetization; and
a permanent magnet layer positioned proximate said second and fourth magnetoresistive sense elements and characterized by a single magnetic orientation, wherein:
said first, second, third, and fourth legs are coupled as a Wheatstone bridge such that said first and fourth magnetoresistive sense elements are coupled in series to form a first half of said Wheatstone bridge, said second and third magnetoresistive sense elements are coupled in series to form a second half of said Wheatstone bridge, said first half of said Wheatstone bridge is coupled in parallel with said second half of said Wheatstone bridge such that a first junction of said first and second magnetoresistive sense elements forms a first input terminal and a second junction of said third and fourth magnetoresistive sense elements forms a second input terminal;
said first, second, third, and fourth magnetoresistive sense elements being sensitive to an external magnetic field along a sensing direction;
said reference magnetization of each of said first, second, third, and fourth pinned layers is oriented substantially parallel to said plane;
said first sense magnetization and said third sense magnetization are oriented in a first <hkl> direction, wherein h, k, and l are Miller indices all of which are non-zero and <hkl> represents a family of directions; and in the absence of said external magnetic field, said permanent magnet layer magnetically biases said second sense magnetization and said fourth sense magnetization in a second <hkl> direction relative to said first <hkl> direction, wherein one of said h, k, and l of said second <hkl> direction is a negative value of a corresponding one of said h, k, and l of said first <hkl> direction.

16. The magnetic field sensor of claim 15 wherein said reference magnetization of each of said first, second, third, and fourth pinned layers is oriented in the same direction substantially parallel said plane and orthogonal to said sensing direction.

17. A magnetic field sensor comprising:
a first sensor bridge having a first leg and a second leg;
a first magnetoresistive sense element formed in said first leg and located in a plane of said magnetic field sensor, said first magnetoresistive sense element including a first pinned layer and a first sense layer, said first sense layer having a first sense magnetization oriented in a first <hkl> direction, wherein h, k, and l are Miller indices all of which are non-zero and <hkl> represents a family of directions;
a second magnetoresistive sense element formed in said second leg and located in said plane of said magnetic field sensor, said second magnetoresistive sense element including a second pinned layer and a second sense layer, said first and second magnetoresistive sense elements being sensitive to a first external magnetic field along a first sensing direction, wherein each of said first and second pinned layers has a reference magnetization oriented substantially parallel to said plane and said second sense layer has a second sense magnetization
a second sensor bridge having a third leg and a fourth leg;
a third magnetoresistive sense element formed in said third leg and located in said plane of said magnetic field sensor, said third magnetoresistive sense element including a third pinned layer and a third sense layer, said third sense layer having a third sense magnetization oriented in said first <hkl> direction;
a fourth magnetoresistive sense element formed in said fourth leg and located in said plane of said magnetic field sensor, said fourth magnetoresistive sense element including a fourth pinned layer and a fourth sense layer, said third and fourth magnetoresistive sense elements being sensitive to a second external magnetic field along a second sensing direction that is orthogonal to said first sensing direction, wherein each of said third and fourth pinned layers has said reference magnetization oriented substantially parallel to said plane; and
a permanent magnet layer positioned proximate said second magnetoresistive sense element and said fourth magnetoresistive sense element, said permanent magnet layer being characterized by a single magnetic orientation, wherein:
in the absence of said first external magnetic field, said permanent magnet layer magnetically biases said second sense magnetization in a second <hkl> direction relative to said first <hkl> direction such that a first one of said h, k, and l of said second <hkl> direction is a negative value of a first corresponding one of said h, k, and l of said first <hkl> direction; and in the absence of said second external magnetic field, said permanent magnet layer magnetically biases said fourth sense magnetization in a third <hkl> direction such that a second one of said h, k, and l of said third <hkl> direction is said negative value of a second corresponding one of said h, k, and l of said first <hkl> direction.

18. The magnetic field sensor of claim 17 further comprising:
a third sensor bridge having a fifth leg and a sixth leg;
a fifth magnetoresistive sense element formed in said fifth leg and located in said plane of said magnetic field sensor, said fifth magnetoresistive sense element including a fifth pinned layer and a fifth sense layer, said fifth sense layer having a fifth sense magnetization oriented in said first <hkl> direction;
a sixth magnetoresistive sense element formed in said sixth leg and located in said plane of said magnetic field sensor, said sixth magnetoresistive sense element including a sixth pinned layer and a sixth sense layer, said fifth and sixth magnetoresistive sense elements being sensitive to a third external magnetic field along a third sensing direction that is orthogonal to each of said first and second sensing directions, wherein each of said fifth and sixth pinned layers has said reference magnetization oriented substantially parallel to said plane; and
said permanent magnet layer is positioned proximate sixth magnetoresistive sense element, wherein in the absence of said third external magnetic field, said permanent magnet layer magnetically biases a sixth sense magnetization of said sixth sense layer in a fourth <hkl> direction such that a third one of said h, k, and l of said fourth <hkl> direction is said negative value of a third corresponding one of said h, k, and l of said first <hkl> direction.

19. The magnetic field sensor of claim 18 wherein:
said first <hkl> direction of said first, third, and fifth sense magnetizations of corresponding ones of said first, third, and fifth magnetoresistive sense elements is characterized by said Miller indices of [111];
said second <hkl> direction of said second sense magnetization of said second magnetoresistive sense element is characterized by said Miller indices of [$\bar{1}$11];
said fourth <hkl> direction of said fourth sense magnetization of said fourth magnetoresistive sense element is characterized by said Miller indices of [1$\bar{1}$1]; and
said sixth <hkl> direction of said sixth sense magnetization of said sixth magnetoresistive sense element is characterized by said Miller indices of [11$\bar{1}$].

20. The magnetic field sensor of claim 18 wherein:
said reference magnetization of each of said first, second, third, and fourth pinned layers is oriented in a first planar direction substantially parallel said plane; and
said reference magnetization of each of said fifth and sixth pinned layers is oriented in a second planar direction perpendicular to said first planar direction and substantially parallel to said plane.

* * * * *